(12) United States Patent
Yoshioka et al.

(10) Patent No.: US 7,954,534 B2
(45) Date of Patent: Jun. 7, 2011

(54) TAPE STICKING APPARATUS AND STICKING METHOD

(75) Inventors: Takahisa Yoshioka, Tokyo (JP); Yoshiaki Sugishita, Tokyo (JP)

(73) Assignee: Lintec Corporation, Tokyo (JP)

( * ) Notice: Subject to any disclaimer, the term of this patent is extended or adjusted under 35 U.S.C. 154(b) by 273 days.

(21) Appl. No.: 12/093,571

(22) PCT Filed: Dec. 4, 2006

(86) PCT No.: PCT/JP2006/324161
§ 371 (c)(1),
(2), (4) Date: May 13, 2008

(87) PCT Pub. No.: WO2007/066610
PCT Pub. Date: Jun. 14, 2007

(65) Prior Publication Data
US 2009/0165958 A1    Jul. 2, 2009

(30) Foreign Application Priority Data

Dec. 9, 2005 (JP) .................... 2005-355918

(51) Int. Cl.
*B32B 37/00* (2006.01)
*B32B 38/10* (2006.01)
*B29C 65/00* (2006.01)

(52) U.S. Cl. ........ 156/517; 156/521; 156/543; 156/541; 156/353; 156/257; 156/264; 156/268; 156/270; 156/248

(58) Field of Classification Search .............. 156/353, 156/522, 552, 257, 264, 265, 268, 519, 521, 156/542, 270, 517, 248, 541, 543; 83/34, 368

See application file for complete search history.

(56) References Cited

U.S. PATENT DOCUMENTS

| | | | | |
|---|---|---|---|---|
| 3,848,490 A | * | 11/1974 | Arel | 83/49 |
| 6,145,423 A | * | 11/2000 | Boreali et al. | 83/145 |
| 2004/0007327 A1 | * | 1/2004 | Kobayashi | 156/353 |
| 2004/0206458 A1 | * | 10/2004 | Hayasaka et al. | 156/391 |

FOREIGN PATENT DOCUMENTS

| | | | |
|---|---|---|---|
| JP | 405069385 A | * | 3/1993 |
| JP | 10-209251 A | | 8/1998 |
| JP | 3174917 B2 | | 4/2001 |
| JP | 2004-040114 A | | 2/2004 |
| JP | 2005-310879 A | | 11/2005 |

OTHER PUBLICATIONS

PCT/JP2006/324161 International Search Report.

* cited by examiner

*Primary Examiner* — Linda L Gray
(74) *Attorney, Agent, or Firm* — Lowe Hauptman Ham & Berner, LLP

(57) ABSTRACT

A tape sticking apparatus includes a feed-out device for feeding out a raw sheet in which a strip-shaped tape base material is temporarily stuck on one surface of a strip-shaped release liner. A cutting device is configured to form a closed-loop-shaped cut-line on the tape base material to form a sticking tape. The apparatus further includes a peeling device for peeling the sticking tape from the release liner, and a sticking device for sticking the sticking tape to a workpiece. A collecting device collects the raw sheet after being peeled off the sticking tape by the peeling device.

4 Claims, 7 Drawing Sheets

TAPE STICKING APPARATUS AND STICKING METHOD

RELATED APPLICATIONS

The present application is based on and claims priority from International Application No. PCT/JP2006/324161, filed Dec. 4, 2006 and Japan Application Number 2005-355918, filed Dec. 9, 2005, the disclosures of which are hereby incorporated by reference herein in their entirety.

FIELD OF THE INVENTION

The present invention relates to a tape sticking apparatus and a sticking method, particularly to a tape sticking apparatus and a sticking method capable of responding to both types of tape base materials prepared with a cut-line and prepared with no cut-line thereon for forming a sticking tape in order to unitize a semiconductor wafer (hereinafter, simply referred to as "wafer") and a ring frame.

Conventionally, a wafer is disposed on the inside of a ring frame, and a dicing tape is stuck on their surfaces in advance of individuating the wafer on which circuit surfaces are formed, thereby fixing the wafer to the ring frame. As a dicing tape sticking procedure described above, the following methods are known. For example, as described in the patent document 1, sticking a strip-shaped dicing tape is stuck to the ring frame and the wafer, the outside of the circumference of the dicing tape is cut off to correspond to the shape of the ring frame using a cutter, and, previously cutting the dicing tape corresponding to the shape of the ring frame and sticking it to the ring frame.

Patent Document 1: Japanese Patent Application Laid-Open No. 2004-40114

SUMMARY OF THE INVENTION

Problem to be Solved by the Invention

However the tape sticking apparatus dual-use of a general-purpose dicing tape and a precut dicing tape described in the patent document 1 has such a disadvantage that the ring frame is severely damaged by the cutter because the dicing tape is cut within the surface of the ring frame in the case of cutting the dicing tape corresponding to the shape of the ring frame after sticking the general-purpose dicing tape thereon. Especially, severity of the damage becomes more pronounced in the case of a resin-made ring frame being used for enabling to manufacture it inexpensively and attaining weight saving.

OBJECT OF THE INVENTION

The present invention has been proposed in view of the above disadvantage, and the object of the present invention is to provide an tape sticking apparatus and a sticking method capable of responding to both types of tape base materials prepared with a cut-line and prepared with no cut-line thereon corresponding to the shape of the plate-like member or the ring frame, also to form the cut-line on the pathway of feeding out when no cut-line is formed so as not to damage the ring frame and the like.

Means for Solving the Problem

To achieve the above object, the present invention adopts such an arrangement, includes:

a feed-out device for feeding out a raw sheet in which a strip-shaped tape base material is temporarily stuck on one surface of a strip-shaped release liner; a cutting device which is disposed on the pathway of feeding out the raw sheet, and is forming a closed-loop-shaped cut-line on the tape base material to form a sticking tape which is to be stuck to a predetermined plate-like member; a peeling device for peeling the sticking tape from the release liner; a sticking device for sticking the sticking tape to the plate-like member by relatively moving the plate-like member and the peeling device; and a collecting device for collecting the raw sheet after peeling off of the sticking tape by the peeling device; wherein a cut-line detecting device for detecting whether any cut-line is already formed on the tape base material is disposed on the upstream side of the feeding out direction of the raw sheet with respect to the cutting device, and the cutting device lets the raw sheet pass straight through without forming any cut-line when the cut-line already formed on the tape base material is detected by the cut-line detecting device, while, the cutting device forms the cut-line when no cut-line is detected.

Also, the present invention may adopt such an arrangement, includes:

a feed-out device for feeding out a raw sheet in which a strip-shaped tape base material having an adhesive sheet portion with a size of substantially corresponding to the shape of a plate-like member is temporarily stuck on one surface of a strip-shaped release liner; a cutting device which is disposed on the pathway of feeding out the raw sheet, and is forming a closed-loop-shaped cut-line corresponding to the shape of the ring frame to be encircling the adhesive sheet portion on the tape base material to form a sticking tape; a peeling device for peeling the sticking tape from the release liner; a sticking device for sticking the sticking tape to the ring frame by relatively moving the plate-like member disposed on the inside of the ring frame and the peeling device so that the adhesive sheet portion is substantially corresponding to the surface of the plate-like member; and a collecting device for collecting the raw sheet after peeling off of the sticking tape by the peeling device; wherein a cut-line detecting device for detecting whether any cut-line is already formed on the tape base material is disposed on the upstream side of the feeding out direction of the raw sheet with respect to the cutting device, and the cutting device lets the raw sheet pass straight through without forming any cut-line when the cut-line already formed on the tape base material is detected by the cut-line detecting device, while, the cutting device forms the cut-line when no cut-line is detected.

Further, the present invention adopts such an arrangement that a tape sticking method, for sticking a sticking tape to a plate-like member disposed on a table, includes:

a process for feeding out a raw sheet in which a strip-shaped tape base material is temporarily stuck on one surface of a strip-shaped release liner; a process for detecting whether any cut-line is already formed on the tape base material for forming the sticking tape when feeding out the raw sheet; a process for not forming any cut-line when the cut-line already formed on the tape base material is detected, while, forming the cut-line when no cut-line is formed; and a process for peeling the sticking tape from the release liner, and for sticking it to the plate-like member.

Still further, the present invention adopts such an arrangement that a tape sticking method, for fixing a plate-like member to a ring frame by disposing the ring frame on a table, and disposing the plate-like member on the inside of the ring frame, and then sticking a sticking tape to the ring frame, includes:

a process for feeding out a raw sheet in which a strip-shaped tape base material having an adhesive sheet portion with a size of substantially corresponding to the shape of the plate-like member is temporarily stuck on one surface of a strip-shaped release liner;

a process for detecting whether any cut-line is already formed on the tape base material for forming the sticking tape at feeding out the raw sheet;

a process for not forming any cut-line when the cut-line is already formed on the tape base material, while, forming the cut-line when no cut-line is formed; and a process for peeling the sticking tape from the release liner, and for sticking the sticking tape to the ring frame so that the adhesive sheet portion is substantially corresponding to the plate-like member.

According to the present invention, since such an arrangement is adopted that the cut-line detecting device detects whether any cut-line is already formed on the tape base material, and the cutting device lets the raw sheet pass straight through without forming any cut-line when the cut-line already formed is detected, while, the cutting device forms the cut-line on the pathway of feeding out the raw sheet when no cut-line is detected, general versatility to be applicable regardless of presence or absence of the cut-line on the raw sheet can be provided, and the factors causing damages to the ring frame and the like can be cleared away.

Additionally, in the present invention, the "closed-loop" requires only a shape with no edge, therefore it includes also elliptical shapes, polygonal shapes, and the like, not only a shape closed in a circle.

EXPLANATION OF REFERENCE NUMERALS

10: mounting apparatus (tape sticking apparatus)
11: feed-out device
13: die cutting device (cutting device)
14: position detecting device
15: peeling device
16: sticking device
17: collecting device
C: cut-line
DS: die bonding sheet portion (adhesive sheet portion)
DT: dicing tape
DDT: sticking tape
L: raw sheet
RF: ring frame
S: release liner
TB: tape base material
W: semiconductor wafer (plate-like member)

BEST MODE FOR CARRYING OUT THE INVENTION

Hereinafter, an embodiment of the present invention will be described with reference to the drawings.

Figure 1:
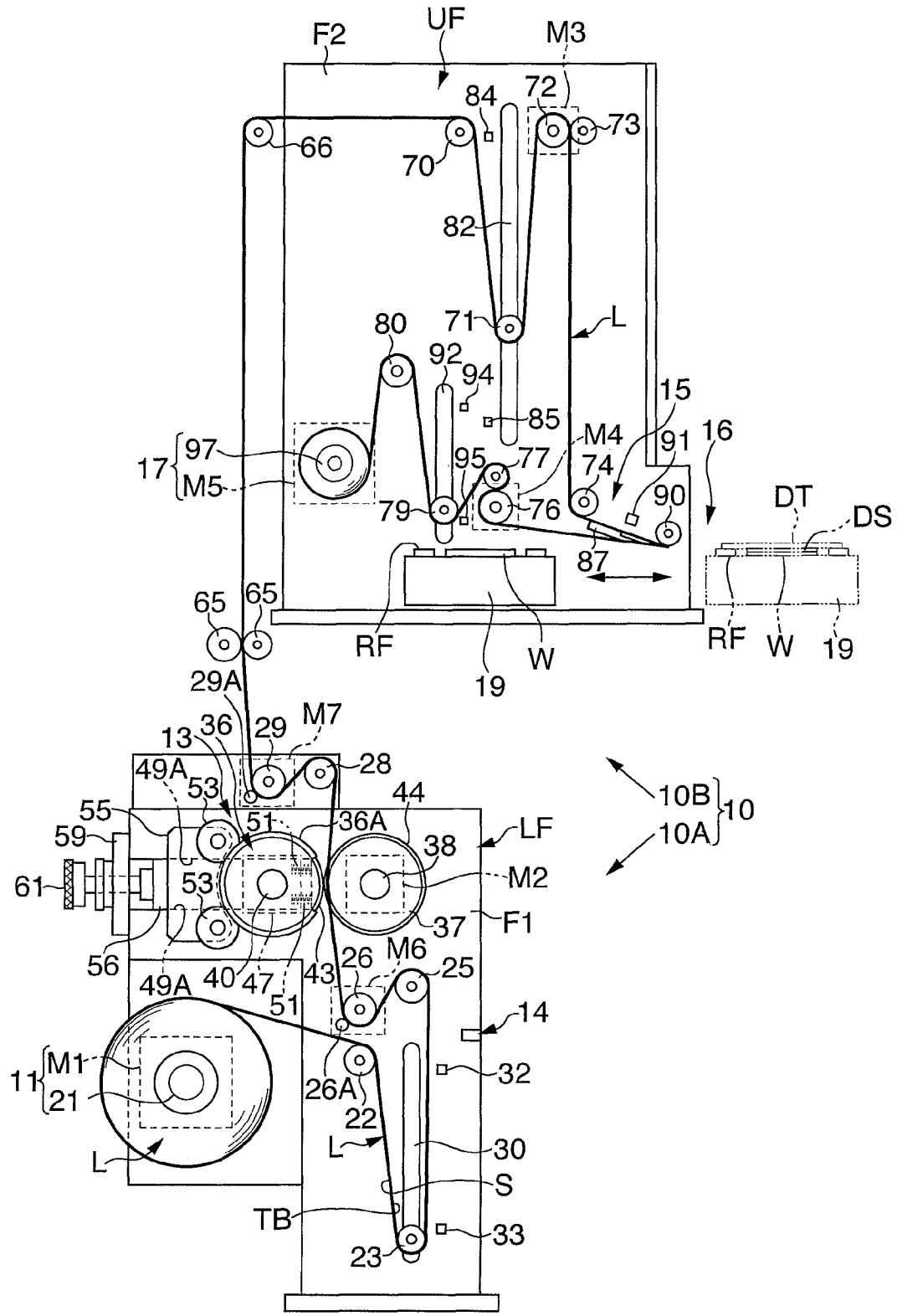
FIG. 1 is a front view schematically showing a mounting apparatus in accordance with the embodiment.
Figure 2A:
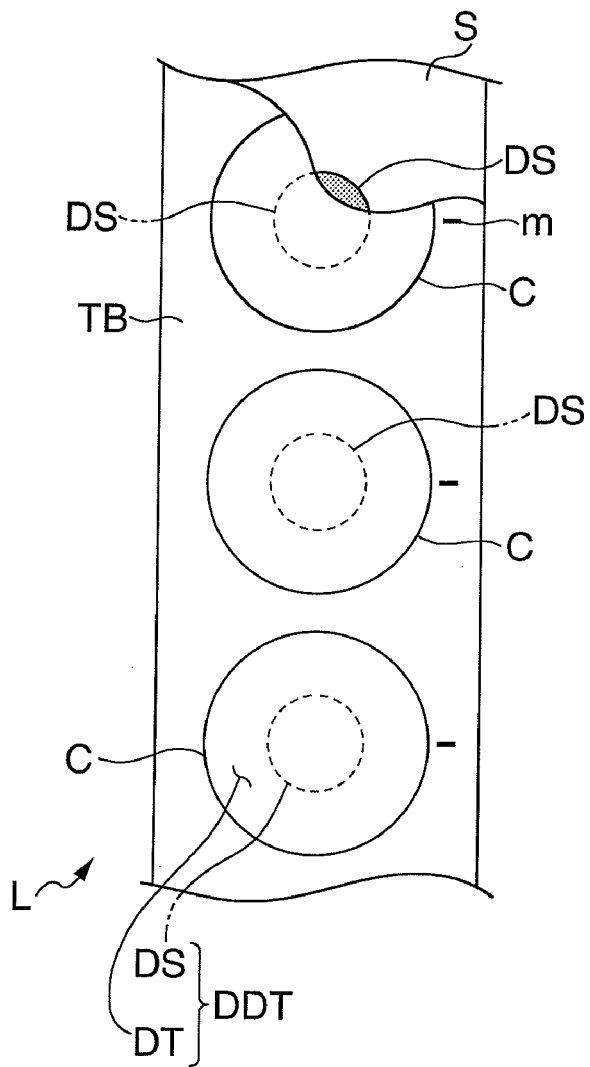
FIG. 2A is a front view showing a raw sheet.
Figure 2B:
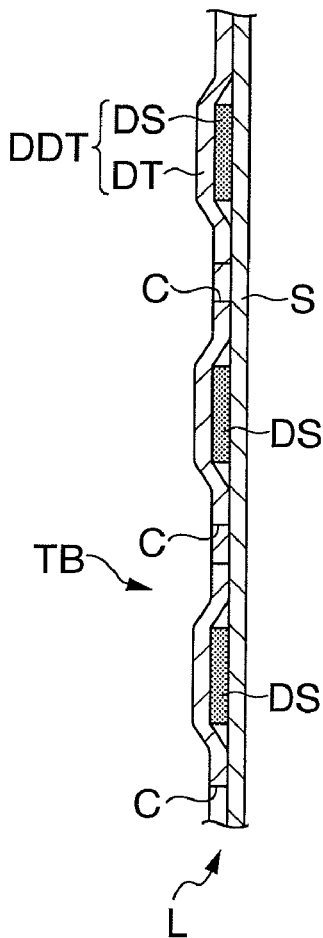
FIG. 2B is a cross sectional view from the right showing the raw sheet.
Figure 2C:
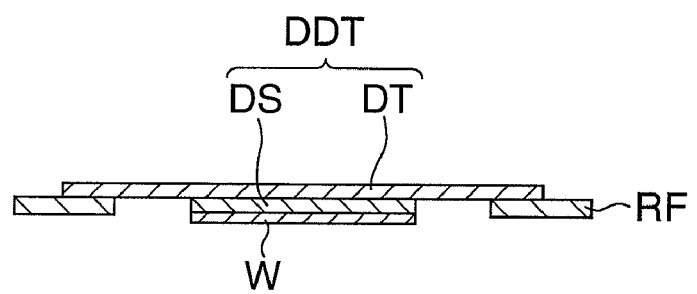
FIG. 2C is a cross sectional view showing a condition of a sticking tape being stuck to a ring frame and a wafer.

FIG. 1 shows a schematic front view of a mounting apparatus to which a tape sticking apparatus according to the embodiment is applied: FIG. 2A and FIG. 2B show a raw sheet which is used in the mounting apparatus; and FIG. 2C shows a cross sectional view of a dicing tape and a die bonding sheet portion being stuck to a ring frame and a wafer. In these drawings, the raw sheet L comprises a strip-shaped tape base material TB which includes the dicing tapes DT having the die bonding sheet portions DS as adhesive sheet portions, and is temporarily stuck on one surface of a strip-shaped release liner S. Each of the die bonding sheet portions DS is a heat sensitive adhesive sheet with a size of substantially corresponding to the shape of the wafer W which as a plate-like member. A mounting apparatus 10 comprises a lower unit 10A and an upper unit 10B. The lower unit 10A comprises: a lower frame LF which includes a pair of frame boards F1 relatively disposed in the direction perpendicular to the paper surface in FIG. 1 (in the vertical direction in FIG. 3); a feed-out device 11 which is disposed within the lower frame LF area and is feeding out the raw sheet L; a die cutting device 13 as a cutting device which forms closed-loop-shaped cut-lines C (refer to FIG. 2A, FIG. 2B, and FIG. 3) on the tape base material TB, each corresponding to the shape of the ring frame RF located on the outside of the circumference of the wafer W, on the pathway of feeding out the raw sheet L to form the dicing tapes DT having the die bonding sheet portions DS (hereinafter, referred to as "sticking tape DDT"); and a cut-line detecting device 14 which is disposed on the upstream side of the feeding out direction of the raw sheet L with respect to the die cutting device 13, and is detecting whether any cut-line C is already formed on the outer circumference side of the die bonding sheet portion DS.

The upper unit 10B comprises: an upper frame UF which includes frame boards F2; a peeling device 15 which is disposed within the upper frame UF area and is peeling the sticking tape DDT from the release liner S; a sticking device 16 for sticking the sticking tape DDT to the ring frame RF and the wafer W respectively; and a collecting device 17 which winds and collects the raw sheet L after peeling off of the sticking tape DDT by the peeling device 15. In the lower side of the peeling device 15, a table 19 is provided to be movable in the right and left directions in FIG. 1 and is containing a heating means for heating the die bonding sheet portion DS in the sticking tape DDT, then the ring frame RF and the wafer W are sucked and supported on the upper surface side of the table 19. In addition, each part of the devices in the lower unit 10A and the upper unit 10B is overall controlled through a control device (not shown).

The feed-out device 11 comprises a motor M1 and a support shaft 21 which is rotationally driven by the motor M1, and the raw sheet L being wound as a roll is supported around the support shaft 21. The raw sheet L fed out from the feed-out device 11 is to be fed out toward the downstream side, that is, toward the upper unit 10B side, through sequentially disposed a guide roll 22, a first dancer roll 23, a guide roll 25, and a feed-out roll 26, then the cut-lines C are formed by the die cutting device 13, and further fed out through a guide roll 28, and a feed-out roll 29, and then brought out to the upper unit 10B side. In this regard, the first dancer roll 23 is provided to be vertically movable along an upwardly and downwardly elongated slot 30 which is formed in the frame boards F1, and over-and-under control of the raw sheet L is performed according to an upper sensor 32 and a lower sensor 33 which are respectively located on the upper portion and the lower portion of the slot 30. And, the feed-out rolls 26 and 29 nip the raw sheet L with their respective nip rolls 26A and 29A, and the tension applying to the raw sheet L therebetween is controlled through their respective torque motors M6 and M7, and also positioning for feeding out is controlled according to the pulse signals from the motors, at the same time.

Figure 3:
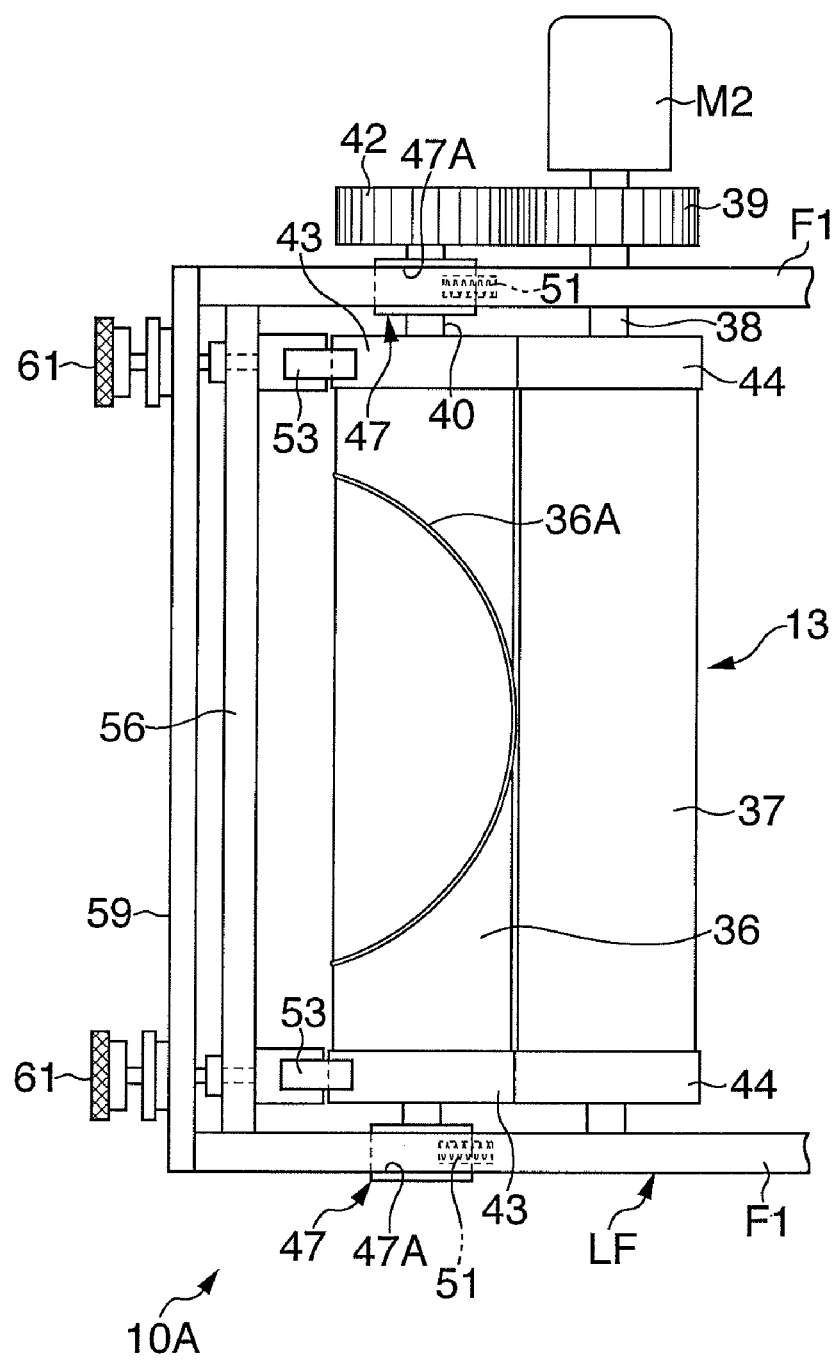
FIG. 3 is a plan view schematically showing an essential part of a die cutting device.
Figure 6:
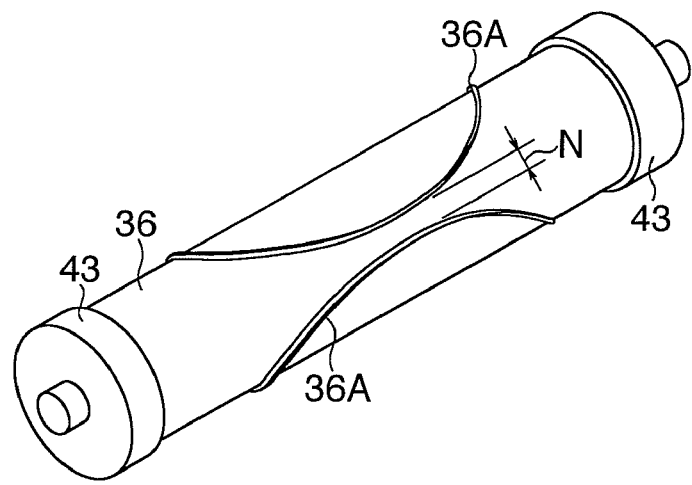
FIG. 6 is a perspective view schematically showing a die cutting roll.
Figure 7:
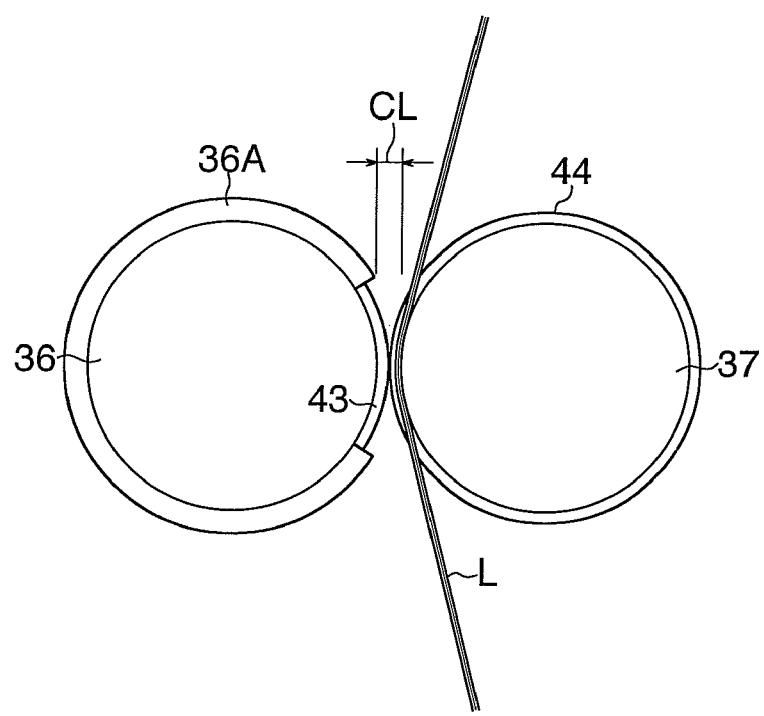
FIG. 7 is a front view schematically showing the die cutting roll and a die bearing roll.

As shown in FIG. 3, the die cutting device 13, which is disposed between the frame boards F1 and F1, comprises: a die cutting roll 36 which is provided with a cutting blade 36A on the peripheral surface thereof; a platen 37 which is relatively disposed to the die cutting roll 36; a motor M2 which rotates the platen 37; a driving gear 39 which is fixed to a rotary shaft 38 of the platen 37; and a driven gear 42 which is fixed to a rotary shaft 40 of the die cutting roll 36 to be engaged with the driving gear 39. And, bearers 43 and 44 are respectively disposed at both sides of the die cutting roll 36 and the platen 37, whereby the die cutting roll 36 and the platen 37 can maintain a constant distance between their central axes, and consequently, cutting of the tape base material TB by the cutting blade 36A can be performed with a high degree of accuracy. In addition, the cutting blade 36A is to have a closed-loop circular shape with a slightly smaller diameter than that of the ring frame RF when the die cutting roll 36 rotates, and is formed at the level of forming the cut-line C on the tape base material TB. Also, as for the cutting blade 36A, as shown in FIG. 6, a blank area N having no blade is provided in the circumferential direction of the die cutting roll 36, therefore as shown in FIG. 7, at a condition that the blank area N absent of the cutter blade 36A faces to the die bearing roll 37, a clearance CL, where the raw sheet L can be passed straight through without forming any cut-line C on the raw sheet L, is maintained by bearers 43 and 44.

Figure 4:
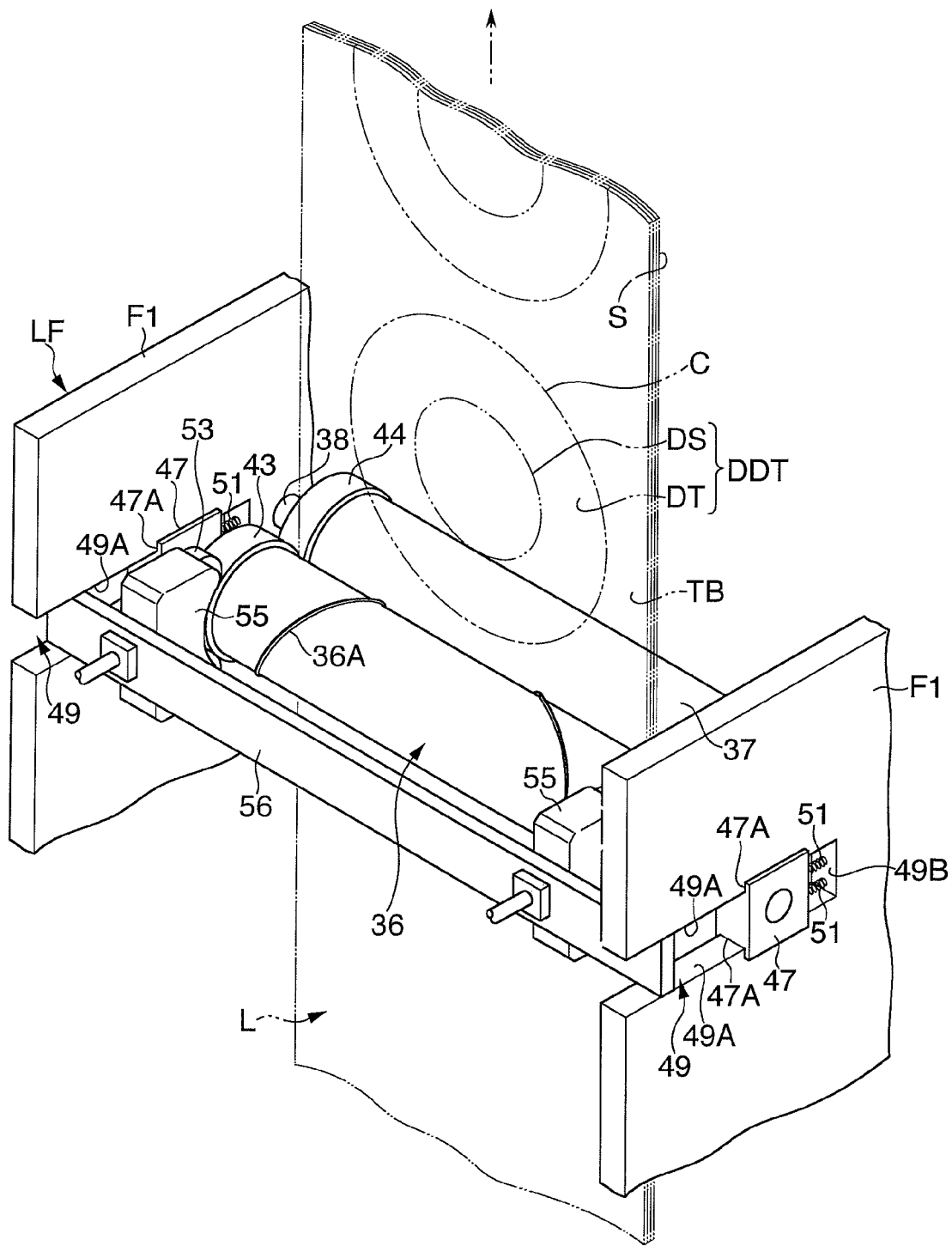
FIG. 4 is a perspective view schematically showing the die cutting device.
Figure 5:
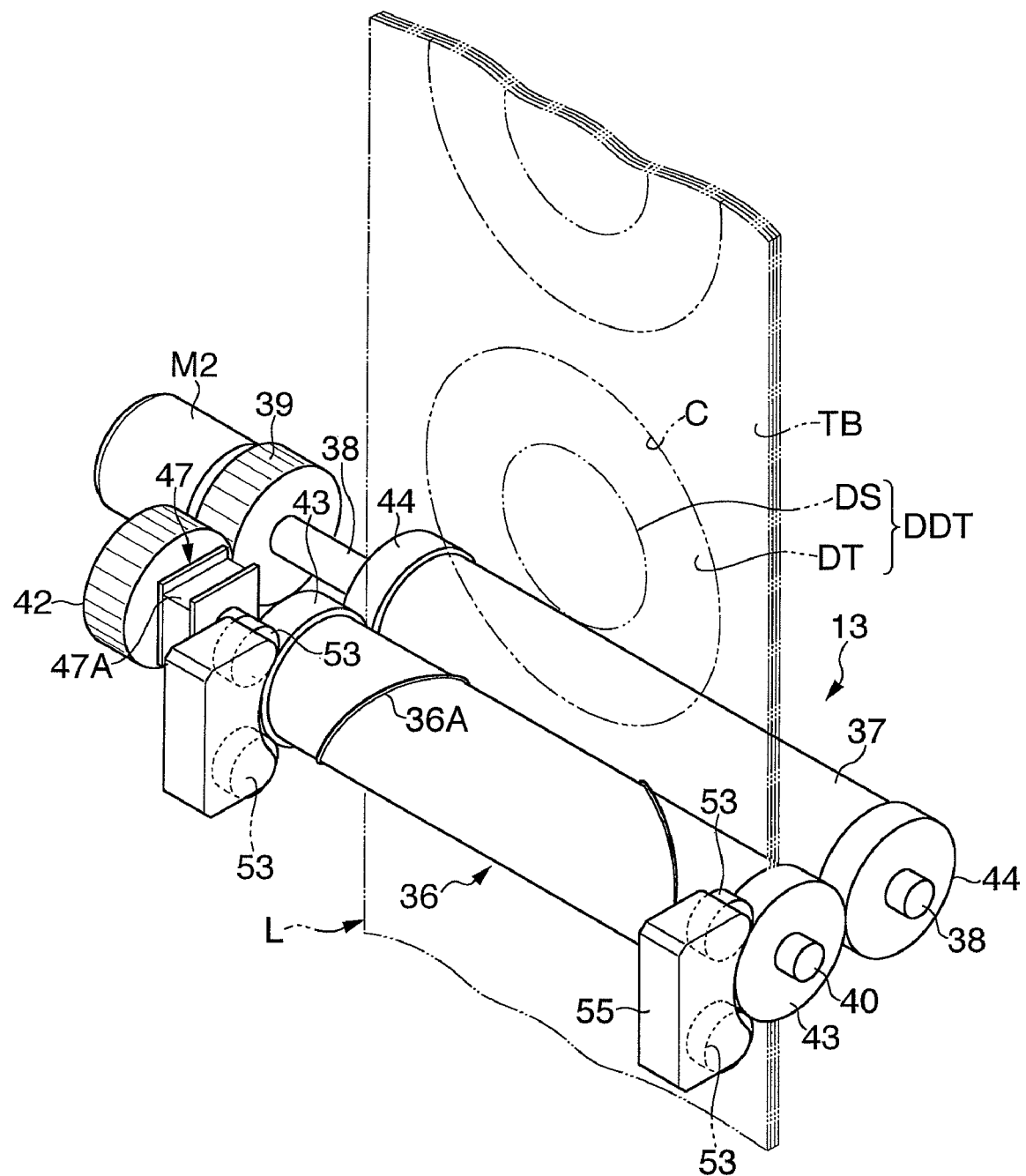
FIG. 5 is a perspective view schematically showing a condition of the die cutting device in which frame boards are omitted.

On both sides of the rotary shaft 40 of the die cutting roll 36, as shown in FIG. 4, slide blocks 47 having bearing function are provided, and these slide blocks 47 are disposed within substantially U-shaped cutout portions 49 formed in the surfaces of the frame boards F1. More specifically, each side-end surface of the slide block 47 is provided in a substantially H-shape, and the upper and the lower formational edges 49A of the cutout portion 49 are set in the upper and the lower grooves 47A respectively so that each slide block 47 is prevented from dropping off in the direction perpendicular to the surfaces of the frame boards F1. And, a spring member 51 is disposed between the slide block 47 and the bottom portion 49B of the U-shape in the cutout portion 49, whereby the die cutting roll 36 is biased toward the direction away from the platen 37 under the presence of the spring members 51.

As for the bearers 43, rollers 53 are disposed contacting with each two points, that is, the upper and the lower points, on the peripheral surface area on the other side of the corresponding bearers 44, respectively. These rollers 53 are provided to be rotatable through bearings 55, and these bearings 55 are connected mutually through a connecting board 56. The connecting board 56 is elongated between the cutout portions 49 formed on both sides of the frame boards F1 to be movable along the right and left directions in FIG. 1. And, the open-end side of the U-shape of each cutout portion 49 is blocked with a board-like member 59 which is elongated between the frame boards F1, and adjusting knobs 61 are provided at two points on the longitudinal direction of the board-like member 59 in order to move the surface position of the connecting board 56 in the right and left directions. In the embodiment, the connecting board 56 can be moved in the right direction in FIG. 1 by turning the adjusting knobs 61 clockwise direction, then the rollers 53 of the bearings 55 which are fixed on the connecting board 56 can move the die cutting roll 36 toward the platen 37 side against the biasing force of the spring members 51 through the bearers 43, so that the bearers 43 on the die cutting roll 36 side and the bearers 44 on the platen 37 side can be adjusted to contact mutually. On the other hand, the die cutting roll 36 can be moved away from the platen 37 with the biasing force of the spring members 51 by turning the adjusting knobs 61 counterclockwise direction.

The cut-line detecting device 14 disposed on the upstream side of the feeding out direction of the raw sheet L with respect to the die cutting device 13 is, in the embodiment, provided in a position shortly before the guide roll 25. As for the cut-line detecting device 14, for example, an optical sensor such as an CCD (charge-coupled device) camera may be used. The cut-line detecting device 14 detects a predetermined position of the cut-line L along the feeding out direction, and issues an operation command to the die cutting device 13 through the control device (not shown) to form the cut-line C to be encircling the die bonding sheet portion DS when no cut-line C is detected. On the other hand, the aforementioned clearance CL is maintained and the operation of the die cutting device 13 is to be maintained in the stopped condition when the cut-line C is detected.

The raw sheet L on which the cut-lines C are already formed in the lower unit 10A is to be fed out to the upper unit 10B through a pair of rolls, that is, a nip roll 65 and a guide roll 66, supported through a supporting device (not shown).

Through the upper unit 10B, a guide roll 70, a second dancer roll 71, a tension roll 72 and a pinch roll 73 which apply a predetermined tension to the raw sheet L by a torque adjustable motor M3, a guide roll 74, and a peeling device 15 are disposed inside the surfaces of the frame boards F2, then the sticking tape DDT is peeled off sequentially by the peeling device 15. Also, the raw sheet L after peeling off of each sticking tape DDT by the peeling device 15 is to be wound up by the collecting device 17 through a driving roll 76 which is driven by a motor M4, a nip roll 77, a third dancer roll 79, and a guide roll 80.

The second dancer roll 71 is provided to be movable along an upwardly and downwardly elongated slot 82 which is formed in the frame boards F2, and over-and-under control on the raw sheet L is performed according to an upper sensor 84 and a lower sensor 85 which are respectively located on the upper area and the lower area of the slot 82. Moreover, even when the operation stops in the upper unit 10B, the die cutting device 13 is not stopped in the middle of forming the cut-line C, and the dancer roll 71 absorbs the fed out amount. Therefore, a disadvantage that the cut-line C cannot be made continuously and precisely when stopping and rotating operations are performed in the middle of forming the cut-line C can be cleared away. The motor M3 biases the tension roll 72 toward the opposite direction from the feeding out direction so that the raw sheet L between the tension roll 72 and the driving roll 76 can remain a predetermined tension.

The peeling device 15 comprises, in the embodiment, a peel plate 87, with which the sticking tape DDT can be peeled off from the raw sheet L by sharply folding back against the feeding out direction of the raw sheet L at the edge position of the peel plate 87, then the sticking tape DDT is stuck on the upper surfaces of the ring frame RF and the wafer W on the table 19 which moves according to the timing of the peeling operation. In this regard, a press roll 90 which forms the sticking device is disposed on the edge side of the peel plate 87. The press roll 90 applies a predetermined pressure to the sticking tape DDT, which is already peeled, to stick it on the surfaces of the ring frame RF and the wafer W. In addition, a sensor 91 is disposed on the near side of the press roll 90 (the upstream side of the feeding out direction of the raw sheet L), and a position of the forward end of the sticking tape DDT in the feeding direction is detected by the sensor 91, and then movement timing coordination of the table 19 is performed, whereby the sticking tape DDT is stuck to the ring frame RF, thus the die bonding sheet portion DS is to be stuck to the wafer W in a substantially corresponding condition.

The third dancer roll 79 is provided to be movable along an upwardly and downwardly elongated slot 92 which is formed in the frame boards F2, and winding control on the collecting device 17 is performed according to an upper sensor 94 and a lower sensor 95 which are respectively located on the upper portion and the lower portion of the slot 92. The collecting device 17 comprises a motor M5 and a winding shaft 97 which is linked with the motor M5.

Next, an overall operation of the mounting apparatus 10 according to the embodiment will be described.

As for the initial operation, pull out the raw sheet L from the feed-out device 11 and, as shown in FIG. 1, fix the leading edge of the raw sheet L to the winding shaft 97 of the collecting device 17. On the other hand, put the ring frame RF and the wafer W on the upper surface of the table 19 to be sucked, and put them on standby in the position shown in the full line in FIG. 1.

According to the operation start signal, the control device overall controls each part of the devices in each of the upper and lower units 10A and 10B. That is, when the motors M1 to M7 start driving and feeding out with the raw sheet L is activated, the first to the third dancer rolls 23, 71 and 79 move upward and downward to maintain a constant tension on the raw sheet L while performing the feeding out operation of the raw sheet L. And, in the process of feeding out, the cut-line detecting device 14 detects the presence or absence of the cut-line C, and then the cut-line C is provided on the tape base material TB to be encircling the die bonding sheet portion DS to form the sticking tape DDT by the die cutting device 13 when no cut-line C is formed on the raw sheet L. On the other hand, the operation of the die cutting device 13 is to be maintained in the stopped condition, and the raw sheet L is to be passed straight through without stopping when the cut-line C is already formed.

In the upper unit 10B, when the sticking tape DDT is detected by the sensor 90 provided near the peel plate 87, the table 19 starts moving toward the right side in FIG. 1 according to the predetermined timing, and then the sticking tape DDT which is peeled off sequentially at the edge position of the peel plate 87 is fed out on the ring frame RF and the wafer to be stuck thereto by the press roll 90.

Therefore, according to the embodiment as described above, such effects are obtained that the tape sticking apparatus having general versatility applicable to both types of the tape base materials TB, as the raw sheets L, prepared with a cut-line C and prepared with no cut-line C thereon can be provided.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, material, quantity and/or other detailed setup without departing from the technical spirit and the range of the object of the present invention.

Accordingly, it is to be understood that the descriptions limited in the shape and the like disclosed above are meant to be merely illustrative and explanatory to facilitate understanding the present invention and not restrictive of the invention. Therefore, descriptions by names of the elements by removing a part or all of the limitations such as about the shape shall be included in the present invention.

Figure 8:
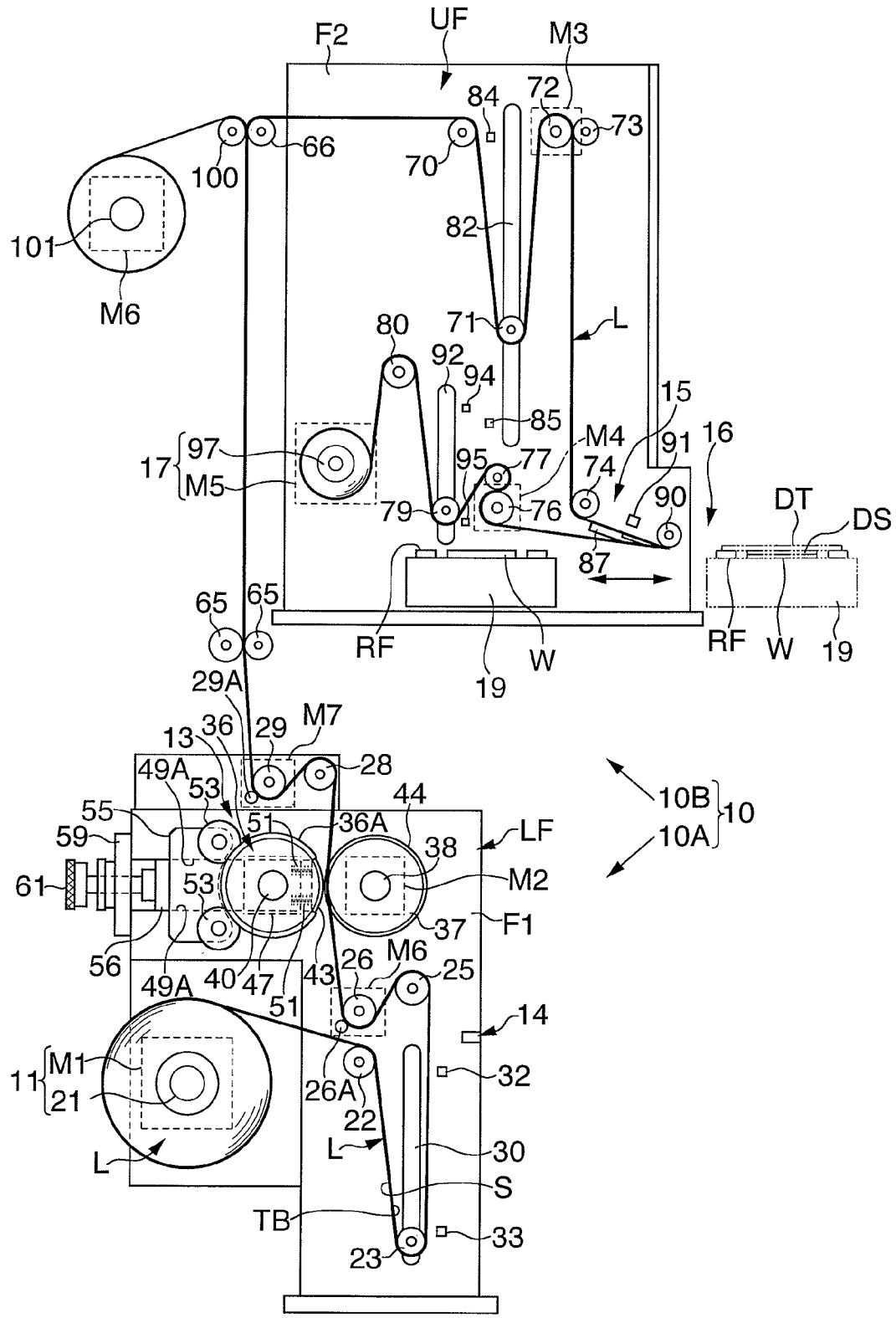
FIG. 8 is a front view schematically showing an alternative example similar to FIG. 1.

For example, in the above embodiment, such an arrangement is adopted that the raw sheet L to be collected by the collecting device 17 includes the release liner S and the unnecessary tape portion in the tape base material TB after peeling the sticking tape DDT. However, the present invention is not limited to the above. For example, as shown in FIG. 8, by providing a pinch roll 100 which is in abutting contact with a guide roll 66, and a winding device 101 which is capable of rotating by a motor M8, the area outside of the cut-lines C in the tape base material TB, that is, the unnecessary tape portion resulting from forming of the cut-lines C, may be collected on the pathway of feeding out. Accordingly, the raw sheet L after passing through the winding device 101 is to be fed out toward the peeling device 15 side in the condition only the sticking tape DDT are provided on one surface of the release liner S, and only release liner S is to be wound and collected by the collecting device 17.

Further, although an example in which the present invention is applied to the mounting apparatus for forming the sticking tape DDT from the raw sheet L to stick it to the ring frame RF and the wafers W has been illustrated and described, the present invention is not limited to the above. The present invention may be generally applied also to other tape sticking apparatus for other adherends, such as a compact disc (CD), a digital versatile disc (DVD), panels for display and glass.

Furthermore, in the embodiment, the mounting apparatus 10 is made up as a two-unit structure with the lower unit 10A and the upper unit 10B. However, the units 10A and 10B may be provided also as a laterally parallel structure, or may be made up as a single unit. Additionally, in the case of making up the units by each separate unit as the embodiment, versatility to be capable of decoupling the units for using them as each independent unit is given.

Still further, in the embodiment, the die cutting device 13 is adopted as the cutting device to form the cut-lines C on the tape base material TB. However, also other devices may be adopted to form the cut-lines C using a rotary blade along the surface of the tape base material TB.

What is claimed is:

1. A tape sticking apparatus, comprising:
   a feed-out device for feeding out a raw sheet in which a strip-shaped tape base material, having an adhesive sheet portion with a size substantially corresponding to the shape of a plate-shaped member, is temporarily stuck on one surface of a strip-shaped release liner;
   a cutting device disposed on a pathway feeding out the raw sheet, the cutting device being configured to form a closed-loop-shaped cut-line corresponding to the shape of a ring frame encircling the adhesive sheet portion on the tape base material to form a sticking tape;
   a peeling device for peeling the sticking tape from the release liner;
   a sticking device for sticking the sticking tape to the ring frame, by moving the plate-shaped member disposed on the inside of the ring frame relative to the peeling device so that the adhesive sheet portion substantially corresponds to the surface of the plate-shaped member; and a cut-line detecting device, for detecting whether any cut-line is already formed on the tape base material, is disposed on an upstream side of the cutting device with respect to a feeding out direction of the raw sheet;

wherein said cutting device includes a die cutting roll having a cutting blade on a circumferential peripheral surface thereof, the die cutting roll having a blank area with no cutting blade disposed on a portion of said circumferential peripheral surface, and a platen disposed opposite to the die cutting roll;

wherein the cutting device is configured to allow the raw sheet to pass without forming a cut-line when said blank area faces the platen; and wherein the cutting device is configured to form the cut cut-line when no cut-line is detected on the tape base material.

2. The tape sticking apparatus according to claim 1, wherein said cutting blade is formed into a closed loop shape.

3. The tape sticking apparatus according to claim 1, wherein said peeling device is a peel plate and the sticking device is a press roll disposed on an edge side of the peel plate.

4. The tape sticking apparatus according to claim 1, wherein said platen, disposed in the pathway feeding out the raw sheet, is configured to apply tension to the raw sheet at a point on the platen opposite the die cutting roll, bending the raw sheet around the platen, and angling side portions of the raw sheet on either side of the point opposite the die cutting roll, away from the die cutting roll.

* * * * *